United States Patent
Dempoh et al.

(10) Patent No.: US 12,553,128 B2
(45) Date of Patent: Feb. 17, 2026

(54) PARTICLE SUPPRESSION METHOD

(71) Applicant: Tokyo Electron Limited, Tokyo (JP)

(72) Inventors: Kazuki Dempoh, Yamanashi (JP);
Daeho Kim, Hillsboro, OR (US);
Atsushi Matsumoto, Yamanashi (JP);
Hideaki Yamasaki, Yamanashi (JP)

(73) Assignee: Tokyo Electron Limited, Tokyo (JP)

(*) Notice: Subject to any disclaimer, the term of this patent is extended or adjusted under 35 U.S.C. 154(b) by 656 days.

(21) Appl. No.: 17/938,335

(22) Filed: Oct. 6, 2022

(65) Prior Publication Data

US 2023/0124029 A1    Apr. 20, 2023

(30) Foreign Application Priority Data

Oct. 15, 2021 (JP) ................... 2021-169717

(51) Int. Cl.
*C23C 16/08* (2006.01)
*C23C 16/44* (2006.01)

(52) U.S. Cl.
CPC .......... *C23C 16/4404* (2013.01); *C23C 16/08* (2013.01)

(58) Field of Classification Search
CPC ................... C23C 16/08; C23C 16/4404
See application file for complete search history.

(56) References Cited

U.S. PATENT DOCUMENTS

| | | | | |
|---|---|---|---|---|
| 5,610,106 A | * | 3/1997 | Foster | H01L 21/76843 |
| | | | | 257/E21.582 |
| 5,989,652 A | * | 11/1999 | Ameen | C23C 16/14 |
| | | | | 427/337 |
| 2004/0013818 A1 | | 1/2004 | Moon et al. | |
| 2018/0330951 A1 | * | 11/2018 | Kulshreshtha | G03F 1/38 |

FOREIGN PATENT DOCUMENTS

| | | | |
|---|---|---|---|
| JP | 2002-512307 A | 4/2002 | |
| JP | 2002-167673 A | 6/2002 | |
| JP | 2004232080 A | 8/2004 | |
| JP | 2021034417 A | 3/2021 | |
| KR | 10-0681155 | * 2/2002 | ............ H01L 21/318 |
| KR | 10-2009-0026186 A | 3/2009 | |

(Continued)

OTHER PUBLICATIONS

Escalona, M., et al., "Study of titanium nitride film growth by plasma enhanced pulsed laser deposition at different experimental conditions". Surface & Coatings Technology 405 (2021) 126492, pp. 1-9.*

(Continued)

*Primary Examiner* — Bret P Chen
(74) *Attorney, Agent, or Firm* — Armstrong Teasdale LLP

(57) ABSTRACT

A particle suppression method includes a) supplying a first processing gas containing a halogen element and a metal element into a chamber in which a substrate is accommodated and plasmatizing the first processing gas to form a film containing the metal element on the substrate, b) reducing a surface of a deposit formed on an inner wall of the chamber by supplying a second processing gas including hydrogen gas into the chamber and turning the second processing gas into plasma, and c) nitriding the reduced surface of the deposit by supplying a third processing gas containing a nitrogen element into the chamber.

18 Claims, 10 Drawing Sheets

(56) References Cited

FOREIGN PATENT DOCUMENTS

KR  10-2009-0067187 A   6/2009
WO     2008007675 A1    1/2008
WO     2008047838 A1    4/2008

OTHER PUBLICATIONS

Setyawan, Heru, et al., "Removal of particles during plasma processes using a collector based on the properties of particles suspended in the plasma". J. Vac. Sci. Technol. A 23(3), May/Jun. 2005, pp. 388-393.*

Moriya, Tsuyoshi, et al., "Particle Reduction and Control in Plasma Etching Equipment". IEEE Transactions on Semiconductor Manufacturing, vol. 18, No. 4, Nov. 2005, pp. 477-486.*

* cited by examiner

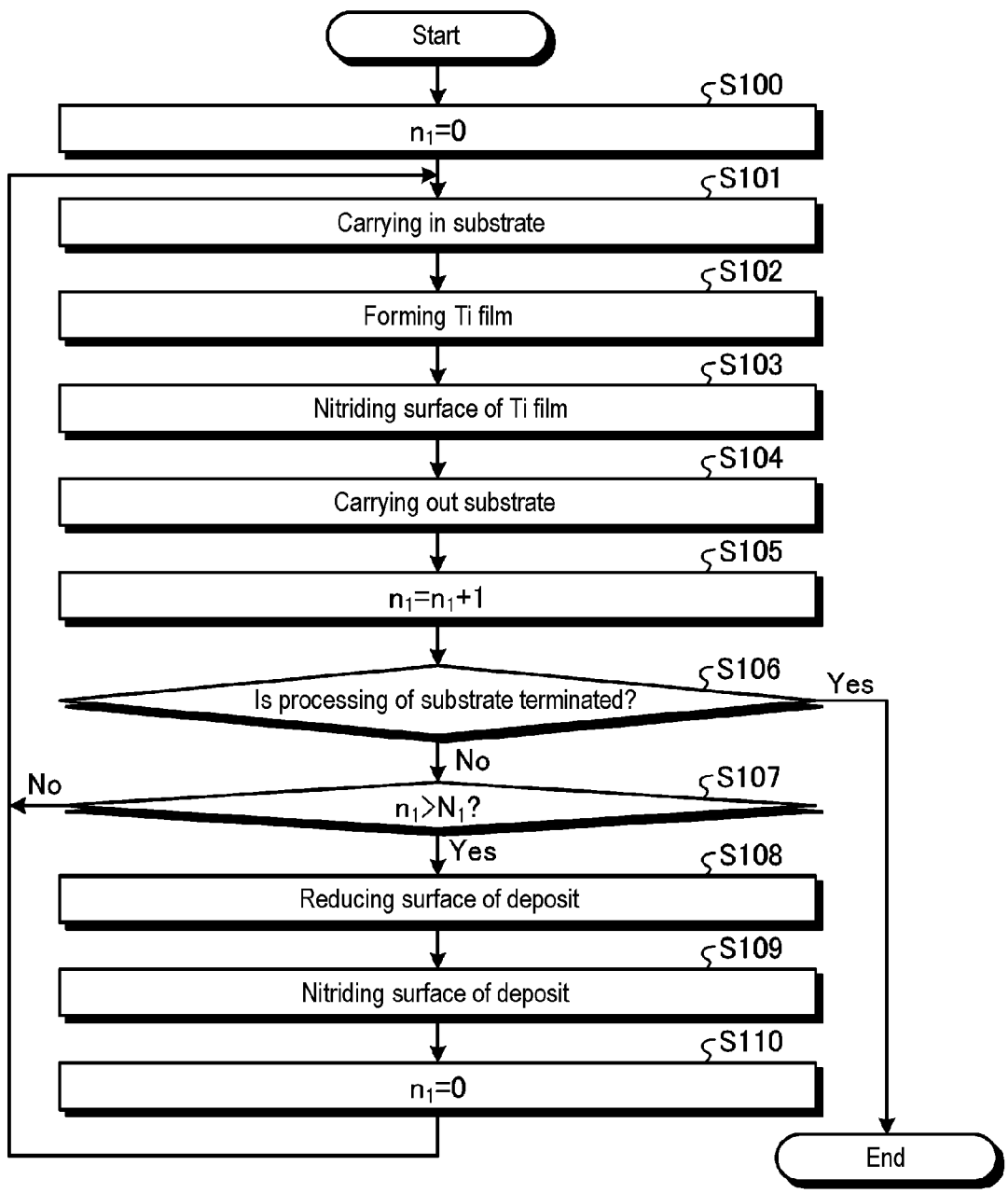

PARTICLE SUPPRESSION METHOD

CROSS-REFERENCE TO RELATED APPLICATION

This application is based upon and claims the benefit of priority from Japanese Patent Application No. 2021-169717, filed on Oct. 15, 2021, the entire contents of which are incorporated herein by reference.

TECHNICAL FIELD

Various aspects and embodiments of the present disclosure relate to a particle suppression method.

BACKGROUND

Patent Document 1 below discloses a technique of forming plasma of a gas including Ar gas and a reducing gas in a chamber 11 for a chemical vapor deposition (CVD) film forming process after cleaning the interior of the chamber 11 with $ClF_3$ gas. This plasma removes a deposit 50 made of a AlF-based substance and adhered to the inner wall of the chamber and/or the surface of a member inside the chamber. Subsequently, a pre-coating gas is supplied into the chamber 11 to form a pre-coating film 51 on the surface from which the deposit 50 has been removed, then a workpiece W is loaded into the chamber 11, and a film forming process is performed.

In addition, Patent Document 2 below describes a method of effectively conditioning and passivating a processing chamber used for depositing a plasma-enhanced Ti-CVD film after wet cleaning or in-situ chemical cleaning, or after each successive deposition step.

PRIOR ART DOCUMENTS

Patent Documents

Patent Document 1: Japanese Laid-Open Publication No. 2002-167673
Patent Document 3: Japanese Laid-Open Publication No. 2002-512307

SUMMARY

According to one embodiment of the present disclosure, there is provided a particle suppression method includes a) supplying a first processing gas containing a halogen element and a metal element into a chamber in which a substrate is accommodated and plasmatizing the first processing gas to form a film containing the metal element on the substrate, b) reducing a surface of a deposit formed on an inner wall of the chamber by supplying a second processing gas including hydrogen gas into the chamber and turning the second processing gas into plasma, and c) nitriding the reduced surface of the deposit by supplying a third processing gas containing a nitrogen element into the chamber.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 2 is a flowchart illustrating an example of a particle suppression method in a first embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Hereinafter, embodiments of a particle suppression method disclosed herein will be described in detail with reference to the drawings. The particle suppression method disclosed herein is not limited by the following embodiments.

In the formation of a film containing a metal element such as titanium, a raw-material gas containing the metal element is supplied into a chamber accommodating a substrate, and a film containing the metal element is formed on the substrate. At this time, since the inner wall of the chamber is also exposed to the raw-material gas, a film containing the metal element also adheres to the inner wall of the chamber as a reaction by-product (hereinafter, referred to as a "deposit"). Therefore, when the formation of the film containing the metal element is performed on a plurality of substrates, the deposit adhering to the inner wall of the chamber becomes thick, and some of the deposit may be turned into particles and scattered inside the chamber. Therefore, it is conceivable to remove the deposit by cleaning the interior of the chamber before the deposit adhered to the inner wall of the chamber is turned into particles and scattered inside the chamber.

When the interior of the chamber is cleaned, a process such as pre-coating of the inner wall of the chamber is performed in order to bring the interior of the chamber into a predetermined state. Since it is impossible to perform a film forming process during cleaning, pre-coating, or the like, it is difficult to improve the throughput of the film forming process. It is conceivable to reduce the number of times of cleaning in order to improve the throughput of the film forming process, but if particles are generated during a period in which cleaning is not performed, the generated particles may cause defects in a semiconductor device formed from the substrate.

Therefore, the present disclosure proposes a technique that is capable of suppressing the generation of particles inside the chamber.

First Embodiment

[Configuration of Plasma Processing Apparatus 100]

Figure 1:
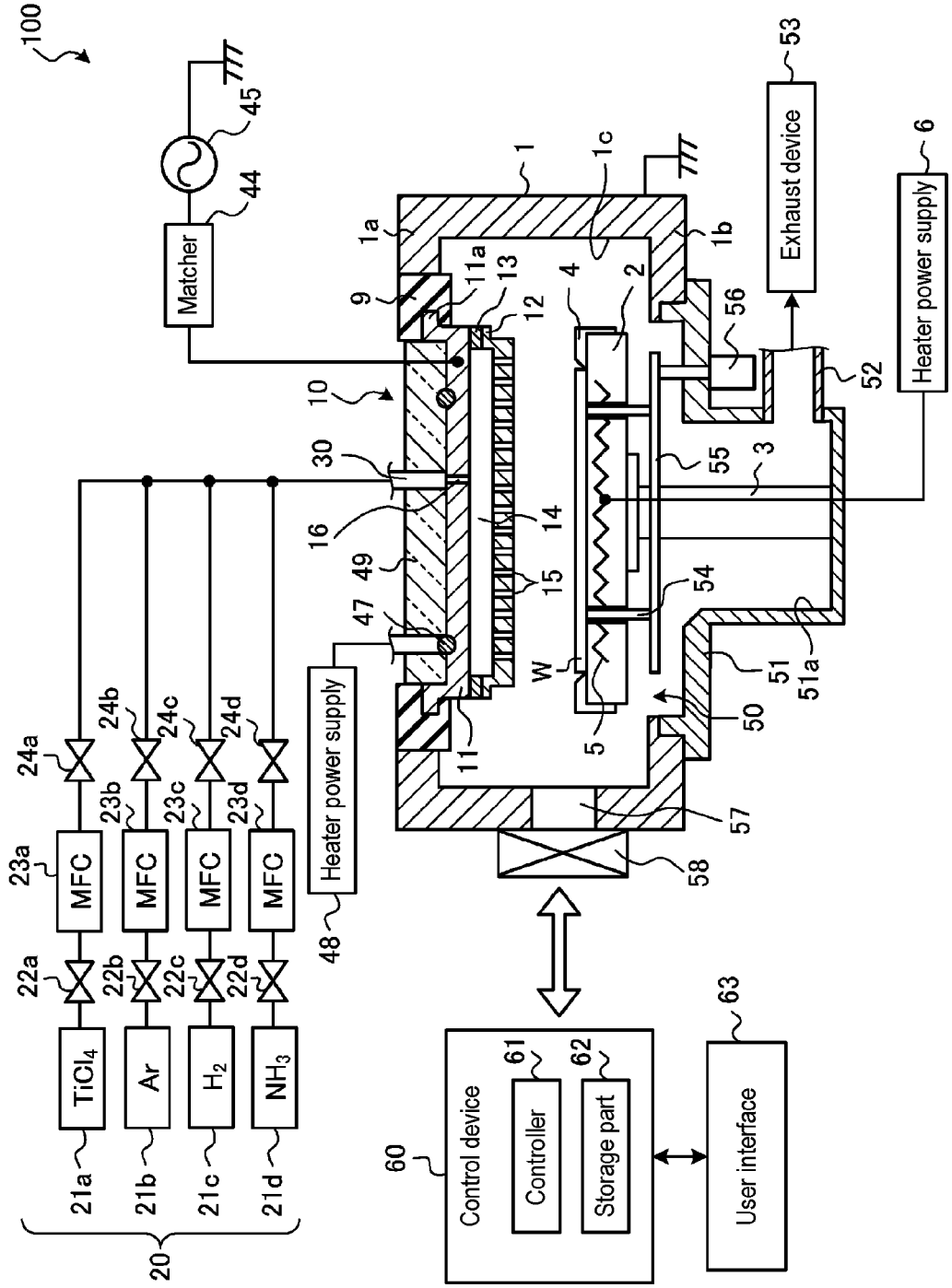
FIG. 1 is a schematic cross-sectional view illustrating an exemplary plasma processing apparatus in a first embodiment.

A particle suppression method according to the present disclosure is implemented by, for example, a plasma processing apparatus 100 illustrated in FIG. 1. FIG. 1 is a schematic cross-sectional view illustrating an example of a plasma processing apparatus 100 in a first embodiment. The plasma processing apparatus 100 in this embodiment is an apparatus for forming a film containing, for example, titanium (Ti), on a substrate W. Ti is an example of a metal element contained in the film formed on the substrate W.

The plasma processing apparatus 100 includes a chamber 1 including an inner wall surface formed of an anodized aluminum or the like in a substantially cylindrical shape. The chamber 1 is grounded. A susceptor 2 is provided inside the chamber 1. The susceptor 2 is supported by a substantially cylindrical support member 3 provided in the central lower portion of the chamber 1. The susceptor 2 is a placement table (stage) for horizontally supporting the substrate W, and is made of, for example, a ceramic material such as aluminum nitride (AlN), or a metal material such as aluminum or a nickel alloy. The susceptor 2 is grounded via the support member 3.

A guide ring 4 for guiding a substrate W is provided on the outer edge of the susceptor 2. A heater 5 made of a high melting point metal such as molybdenum is embedded in the susceptor 2. A heater power supply 6 is connected to the heater 5. The heater 5 heats the substrate W supported by the susceptor 2 to a predetermined temperature with power supplied from the heater power supply 6.

A shower head 10 is provided on the ceiling wall 1a of the chamber 1 via an insulating member 9. The shower head 10 in this embodiment is a premix-type shower head and includes a base member 11 and a shower plate 12. The outer peripheral portion of the shower plate 12 is fixed to the base member 11 via a substantially annular intermediate member 13 for preventing sticking.

The shower plate 12 has a flange shape, and a concave portion is formed inside the shower plate 12. That is, a gas diffusion space 14 is formed between the base member 11 and the shower plate 12. A flange portion 11a is formed on the outer peripheral portion of the base member 11, and the base member 11 is supported by the insulating member 9 via the flange portion 11a.

A plurality of gas ejection holes 15 is formed in the shower plate 12. A gas introduction hole 16 is formed near the approximate center of the base member 11. The gas introduction hole 16 is connected to a gas supply mechanism 20 via a pipe 30.

The gas supply mechanism 20 includes a gas source 21a containing a halogen element and a metal element, a rare gas source 21b, a hydrogen ($H_2$) gas source 21c, and a gas source 21d containing a nitrogen element. In the present embodiment, the gas containing a halogen element and a metal element is, for example, $TiCl_4$ gas. In the present embodiment, the rare gas is, for example, Ar gas. In the present embodiment, the gas containing a nitrogen element is, for example, ammonia ($NH_3$) gas. The $TiCl_4$ gas is an example of a first processing gas, the gas containing Ar gas and $H_2$ gas is an example of the second processing gas, and the $NH_3$ gas is an example of the third processing gas.

The source 21a is connected to the pipe 30 via a valve 22a, a mass flow controller (MFC) 23a, and a valve 24a. The source 21b is connected to the pipe 30 via a valve 22b, an MFC 23b, and a valve 24b. The source 21c is connected to the pipe 30 via a valve 22c, an MFC 23c, and a valve 24c. The source 21d is connected to the pipe 30 via a valve 22d, an MFC 23d, and a valve 24d. The processing gas supplied into the gas diffusion space 14 through the pipe 30 diffuses in the gas diffusion space 14 and is ejected into the chamber 1 through the gas ejection holes 15 in a shower shape.

A radio frequency (RF) power supply 45 is connected to the base member 11 via a matcher 44. The RF power supply 45 supplies RF power for plasma generation to the base member 11 via the matcher 44. The RF power supplied to the base member 11 is radiated into the chamber 1 via the intermediate member 13 and the shower plate 12. By the RF power radiated into the chamber 1, the processing gas supplied into the chamber 1 is plasmatized. Then, a film containing a metal element is formed on the surface of a substrate W by active species and the like contained in the plasma. In the present embodiment, a Ti film is formed on the substrate W. When the processing gas is plasmatized, a film containing a metal element also adheres to the inner wall 1c of the chamber 1 as a deposit. In the present embodiment, the shower head 10 also functions as the upper electrode of the parallel plate electrodes. Meanwhile, the susceptor 2 also functions as a lower electrode of the parallel plate electrodes.

A heater 47 is provided on the base member 11 of the shower head 10. A heater power supply 48 is connected to the heater 47. The heater 47 heats the shower head 10 to a predetermined temperature with power supplied from the heater power supply 48. As a result, the shower plate 12 is heated to, for example, 350 degrees C. or higher. A heat insulating member 49 is provided on the top surface of the base member 11.

A substantially circular opening 50 is formed in the substantially central portion of the bottom wall 1b of the chamber 1. An exhaust chamber 51 is provided in the opening 50 in the bottom wall 1b to cover the opening 50 and protrude downward. The exhaust chamber 51 includes an inner wall 51a formed of an anodized aluminum or the like. The exhaust chamber 51 is grounded via the chamber 1. An exhaust pipe 52 is connected to a side wall of the exhaust chamber 51. An exhaust device 53 including a vacuum pump is connected to the exhaust pipe 52. The interior of the chamber 1 is capable of being depressurized to a predetermined degree of vacuum by the exhaust device 53.

When the processing gas is plasmatized in the chamber 1, some of the active species contained in the plasma also flow into the exhaust chamber 51. As a result, a film containing a metal element adheres to the inner wall 51a of the exhaust chamber 51 as a deposit.

The susceptor 2 is provided with a plurality of (for example, three) lift pins 54 for raising and lowering the substrate W to protrude and sink with respect to the surface of the susceptor 2. The plurality of lift pins 54 are supported by a support plate 55. The support plate 55 is raised and lowered by driving the drive mechanism 56. As the support plate 55 is raised and lowered, the plurality of lift pins 54 is raised and lowered.

The side wall of the chamber 1 is provided with a transport port 57 for transporting the substrate W to and from a substrate transport chamber (not illustrated) provided adjacent to the chamber 1. The transport port 57 is opened and closed by a gate valve 58.

The plasma processing apparatus 100 includes a control device 60. The control device 60 is, for example, a computer, and includes a controller 61 and a storage part 62. The storage part 62 store in advance programs or the like for controlling various processes to be executed in the plasma processing apparatus 100. The controller 61 controls each part of the plasma processing apparatus 100 by reading and executing the programs stored in the storage part 62.

The programs stored in advance in the storage part 62 may be recorded in a non-transitory computer-readable storage medium and installed in the storage part 62 from the storage medium. The computer-readable storage medium is, for example, a hard disk (HD), a flexible disk (FD), a compact disk (CD), a magneto-optical disk (MO), a memory card, or the like.

The control device 60 is connected to a user interface 63 including a keyboard for an operator to perform an input operation of commands or the like by an operator in order to manage the plasma processing apparatus 100, a display for visualizing and displaying the operating state of the plasma processing apparatus 100, or the like.

[Particle Suppression Method]

FIG. 2 is a flowchart illustrating an example of a particle suppression method in a first embodiment. Each process exemplified in the flowchart of FIG. 2 is implemented by the control device 60 controlling each part of the plasma processing apparatus 100.

First, the control device 60 initializes a variable $n_1$ for counting the number of substrates W to 0 (S100). Then, a substrate W is carried into the chamber 1 (S101). In step S101, the plurality of lift pins 54 is raised by the driving mechanism 56, and the gate valve 58 is opened. Then, the substrate W is carried into the chamber 1 by a transport apparatus (not illustrated) and delivered to the plurality of lift pins 54. Then, the plurality of lift pins 54 is lowered by the drive mechanism 56, and the substrate W is placed on the susceptor 2.

Next, a Ti film is formed on the substrate W (S102). Step S102 is an example of step a) and step a1). In step S102, the substrate W is heated to a predetermined temperature by the heater 5. Then, $TiCl_4$ gas, $H_2$ gas, and Ar gas are supplied into the chamber 1 from the gas supply mechanism 20, and the pressure in the chamber 1 is controlled to a predetermined pressure by the exhaust device 53. Then, by supplying RF power into the chamber 1 via the matcher 44 and the shower head 10, the gas in the chamber 1 is plasmatized, and a Ti film is formed on the surface of the substrate W by the active species contained in the plasma.

The main processing conditions in step S102 are, for example, as follows.

Pressure in chamber 1: 50 to 1,333 Pa
Temperature of substrate W: 320 to 700 degrees C.
RF power: 10 to 3,000 W
$TiCl_4$ gas/$H_2$ gas/Ar gas: 5 to 100 sccm/1 to 500 sccm/10 to 10,000 sccm
Processing time: 1 to 600 seconds Then, the supplying of RF power is stopped, and the supplying of $TiCl_4$ gas is stopped. As a result, the interior of the chamber 1 is filled with Ar gas and $H_2$ gas.

Next, the surface of the Ti film formed on the substrate W is nitrided (S103). Step S103 is an example of step a3). $NH_3$ gas is supplied into the chamber 1 in step S103. As a result, the surface of the Ti film is nitrided.

The main processing conditions in step S103 are, for example, as follows.

Pressure in chamber 1: 50 to 1,333 Pa
Temperature of substrate W: 320 to 700 degrees C.
$NH_3$ gas/$H_2$ gas/Ar gas: 10 to 10,000 sccm/5 to 10,000 sccm/0 to 10,000 sccm
Processing time: 1 to 180 seconds In step S103, RF power may be supplied into the chamber 1 to plasmatize the gas supplied into the chamber 1. In this case, the magnitude of the RF power supplied into the chamber 1 is, for example, 3,000 W or less.

Next, the substrate W is carried out from the chamber 1 (S104). Step S104 is an example of step a4). In step S101, the plurality of lift pins 54 is lifted by the drive mechanism 56, and the substrate W is lifted. Then, the gate valve 58 is opened, and the substrate W is carried out from the chamber 1 by the transport apparatus (not illustrated).

Next, the control device 60 increments the variable $n_1$ by 1 (S105). Then, the control device 60 determines whether or not to terminate the processing of the substrate W (S106). When the processing of the substrate W is terminated (S106: "Yes"), the control device 60 terminates the process illustrated in the flowchart.

When the processing of the substrate W is not terminated (S106: "No"), the control device 60 determines whether or not the variable $n_1$ is greater than a predetermined constant $N_1$ (S107). In the present embodiment, the constant $N_1$ is, for example, an integer of 0 or more. When the variable $n_1$ is equal to or less than the constant $N_1$ (S107: "No"), the process illustrated in step S101 is performed again.

When the variable $n_1$ is greater than the constant $N_1$ (S107: "Yes"), the surface of the deposit adhered to the inner wall 1c of the chamber 1 and the inner wall 51a of the exhaust chamber 51 is reduced (S108). Step S108 is an example of step b). In step S108, $H_2$ gas and Ar gas are supplied from the gas supply mechanism 20 into the chamber 1, and the pressure in the chamber 1 is controlled to a predetermined pressure by the exhaust device 53. Then, RF power is supplied into the chamber 1 via the matcher 44 and the shower head 10 to plasmatize the gas within the chamber 1. Then, the surface of the deposit adhered to the inner wall 1c of the chamber 1 and the inner wall 51a of the exhaust chamber 51 is reduced by the active species contained in the plasma.

The main processing conditions in step S108 are, for example, as follows.

Pressure in chamber 1: 50 to 1,333 Pa
RF power: 3,000 W or less
$H_2$ gas/Ar gas: 5 to 10,000 sccm/0 to 10,000 sccm
Processing time: 1 to 180 seconds Next, the surface of the deposit adhered to the inner wall 1c of the chamber 1 and the inner wall 51a of the exhaust chamber 51 is nitrided (S109). Step S109 is an example of step c). In step S109, $NH_3$ gas is supplied from the gas supply mechanism 20 into the chamber 1, and the pressure in the chamber 1 is controlled to a predetermined pressure by the exhaust device 53. As a result, the surface of the deposit reduced in step S108 is nitrided.

The main processing conditions in step S109 are, for example, as follows.

Pressure in chamber 1: 50 to 1,333 Pa
$NH_3$ gas/$H_2$ gas/Ar gas: 10 to 10,000 sccm/5 to 10,000 sccm/0 to 10,000 sccm
Processing time: 1 to 180 seconds In step S109, RF power may be supplied into the chamber 1 to plasmatize the gas supplied into the chamber 1. In this case, the magnitude of the RF power supplied into the chamber 1 is, for example, 3,000 W or less.

Next, the control device 60 initializes the variable $n_1$ to 0 (S110). Then, the process illustrated in step S101 is performed again.

Figure 3A:
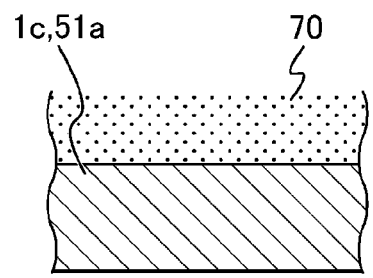
FIG. 3A is a schematic view illustrating an example of a process of coating a deposit adhered to the inner wall of a chamber and the inner wall of an exhaust chamber.

However, when $TiCl_4$ gas is plasmatized in the chamber 1 in step S102, a deposit 70 containing $TiCl_x$ (x is from 1 to 3) adheres to the inner wall 1c of the chamber 1 and the inner wall 51a of the exhaust chamber 51, for example, as illustrated in FIG. 3A. Since the deposit 70 containing $TiCl_x$ is fragile, the deposit 70 easily peels off from the inner wall 1c of the chamber 1 and the inner wall 51a of the exhaust chamber 51 and is turned into particles to be easily scattered into the chamber 1. Therefore, it is conceivable to coat the surface of the deposit 70 with a nitride film to make the deposit 70 difficult to peel off Here, it is thought that, in step S103, when $NH_3$ gas is supplied into the chamber 1, the surface of the deposit 70 formed on the surface of the substrate W is also nitrided.

Figure 4:
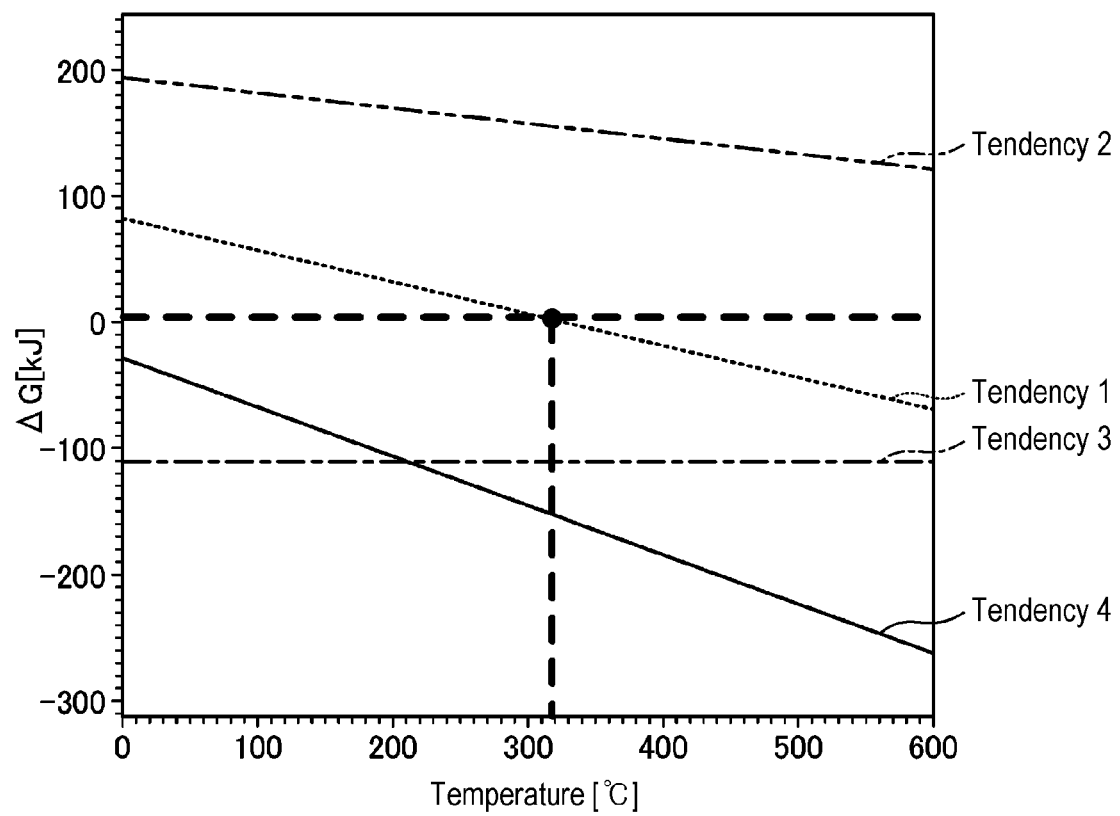
FIG. 4 is a diagram showing an example of relationships between the amount of change in Gibbs free energy and temperature.

FIG. 4 is a diagram showing an example of relationships between the amount of change ΔG in Gibbs free energy and temperature. Tendency 1 illustrated in FIG. 4 shows the relationship between the amount of change AG in Gibbs free energy and temperature in Reaction Formula (1) below.

$$TiCl_3 + NH_3 \rightarrow TiN + 3HCl \qquad (1)$$

Referring to Tendency 1 exemplified in FIG. 4, the reaction of Reaction Formula (1) proceeds, that is, the amount of change ΔG in Gibbs free energy becomes negative when the temperature is 320 degrees C. or higher. Therefore, if it is possible to maintain the inner wall 1c of the chamber 1 and the inner wall 51a of the exhaust chamber 51 at a temperature of 320 degrees C. or higher, the surface of the deposit 70 containing $TiCl_3$ and adhered to the inner wall 1c of the chamber 1 and the inner wall 51a of the exhaust chamber 51 is nitrided by $NH_3$ gas. Then, the surface of the deposit 70 containing $TiCl_3$ changes to TiN according to Reaction Formula (1).

However, it is difficult to heat both the inner wall 1c of the chamber 1 and the inner wall 51a of the exhaust chamber 51 to 320 degrees C. or higher. Therefore, deposit 70, the surface of which is not sufficiently nitrided, remains on the inner wall 1c of the chamber 1 and the inner wall 51a of the exhaust chamber 51, and becomes a source of particle generation.

Therefore, in the present embodiment, in step S108, after the surface of the deposit 70 is reduced by the active species contained in the plasma generated from a gas including $H_2$ gas, the surface of the deposit 70 is nitrided by $NH_3$ gas.

For example, Tendency 2 illustrated in FIG. 4 shows the relationship between the amount of change AG in Gibbs free energy and temperature in Reaction Formula (2) below. Tendency 2 in FIG. 4 shows the tendency in the case where $H_2$ gas is not plasmatized.

$$2TiCl_3 + H_2 \rightarrow 2TiCl_2 + 2HCl \qquad (2)$$

Referring to Tendency 2 in FIG. 4, unless the temperature is much higher than 600 degrees C., the amount of change ΔG in Gibbs free energy does not become negative, and the reaction represented by Reaction Formula (2) does not proceed.

In contrast, for example, Tendency 3 illustrated in FIG. 4 shows the relationship between the amount of change ΔG in Gibbs free energy and temperature in Reaction Formula (3) below. In addition, Tendency 3 in FIG. 4 shows the tendency when $H_2$ gas is plasmatized.

$$TiCl_3 + H \rightarrow TiCl_2 + HCl \qquad (3)$$

Referring to Tendency 3 in FIG. 4, the amount of change ΔG in Gibbs free energy is negative in almost all temperature zones. Therefore, the reaction represented by Reaction Formula (3) proceeds in almost all temperature zones.

For example, Tendency 4 illustrated in FIG. 4 shows the relationship between the amount of change ΔG in Gibbs free energy and temperature in Reaction Formula (4) below.

$$2TiCl_2 + 2NH_3 \rightarrow 2TiN + 4HCl + H_2 \qquad (4)$$

Referring to Tendency 4 in FIG. 4, in a positive temperature zone, the amount of change AG in Gibbs free energy is negative, and thus the reaction represented by Reaction Formula (4) proceeds even at a temperature lower than 320 degrees C. (e.g., room temperature).

Thus, on the inner wall 1c of the chamber 1 and the inner wall 51a of the exhaust chamber 51, which are difficult to maintain at a temperature of 320 degrees C. or higher, even when $NH_3$ gas is supplied to the deposit 70 containing $TiCl_3$, the surface of the deposit 70 is difficult to nitride, for example, as shown in Tendency 1 of FIG. 4.

Figure 3B:
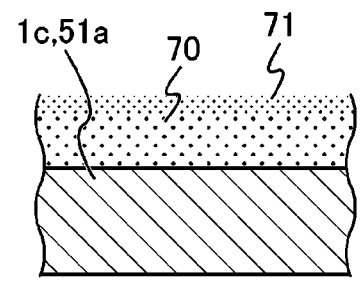
FIG. 3B is a schematic view illustrating an example of a process of coating a deposit adhered to the inner wall of the chamber and the inner wall of the exhaust chamber.

In contrast, in the present embodiment, by exposing the deposit 70 containing $TiCl_3$ to plasma generated from $H_2$ gas, $TiCl_3$ is reduced to $TiCl_2$ at a temperature lower than 320 degrees C., as shown in Tendency 3 of FIG. 4. As a result, a layer 71 containing $TiCl_2$ is formed on the surface of the deposit 70, for example, as illustrated in FIG. 3B.

Figure 3C:
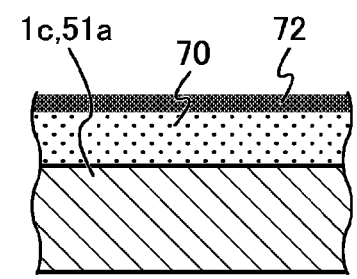
FIG. 3C is a schematic view illustrating an example of a process of coating a deposit adhered to the inner wall of the chamber and the inner wall of the exhaust chamber.

Then, by exposing the layer 71 containing $TiCl_2$ to $NH_3$ gas, $TiCl_2$ is nitrided to TiN at a temperature lower than 320 degrees C. as represented by Tendency 4 of FIG. 4 and Reaction Formula (4) above. As a result, the nitride layer 72 containing TiN is formed on the surface of the deposit 70, for example, as illustrated in FIG. 3C. As a result, the surface of the deposit 70, which easily peels off, is coated with the nitride layer 72 containing TiN so that scattering of the deposit 70 can be suppressed. This makes it possible to reduce the number of times cleaning is performed to remove the deposit 70 so that the throughput of the film forming process can be improved.

In step S102 as well, it is thought that, since $H_2$ gas is plasmatized in the chamber 1, the surface of the deposit 70 adhered to the inner wall 1c of the chamber 1 and the inner wall 51a of the exhaust chamber 51 is reduced by H atoms contained in the plasma. However, the flow rate of $H_2$ gas in step S102 is substantially the same as the flow rate of $TiCl_4$ gas. Therefore, the density of H atoms contained in the plasma is lower than the density of $TiCl_4$ molecules and $H_2$ molecules by five digits of magnitude or more. Therefore, in step S102, even though it is possible to reduce the $TiCl_x$ adhered to the substrate W by H atoms, it is difficult to sufficiently reduce the surface of the deposit 70 adhered to the inner wall 1c of the chamber 1 and the inner wall 51a of the exhaust chamber 51 by the H atoms.

In step S102, Ar gas is supplied into the chamber 1, and Ar ions are contained in the plasma. It is possible to reduce TiCl$_x$ with Ar ions. However, since the diffusion coefficient of Ar ions is smaller than that of H atoms, Ar ions are present in large numbers in a space between the electrodes where plasma exists, but are difficult to reach the inner wall 1c of the chamber 1 and the inner wall 51a of the exhaust chamber 51 located away from the electrodes. Therefore, it is difficult to sufficiently reduce, with Ar ions, the surface of the deposit 70 adhered to the inner wall 1c of the chamber 1 and the inner wall 51a of the exhaust chamber 51.

Therefore, in the present embodiment, in step S108 in which the TiCl$_4$ gas is not supplied, the H$_2$ gas is plasmatized in the chamber 1. This makes it possible generate a large number of H atoms in the chamber 1 and to diffuse the H atoms that have a diffusion coefficient larger than that of Ar ions in the chamber 1. This makes it possible to supply a sufficient amount of H atoms to the surface of the deposit 70 adhered to the inner wall 1c of the chamber 1 and the inner wall 51a of the exhaust chamber 51. Therefore, it is possible to sufficiently reduce the surface of the deposit 70 adhered to the inner wall 1c of the chamber 1 and the inner wall 51a of the exhaust chamber 51 by the reaction according to Reaction Formula (3) described above.

When the film forming process of the Ti film on the substrate W is repeated, the deposit 70 is laminated again on the nitride layer 72. In that case, a nitride layer 72 is further formed thereon. By alternately laminating the deposit 70 and the nitride layer 72 in this way, it is possible to make the deposit 70 difficult to peel off from the inner wall of the chamber 1 or the like.

Figure 5A:
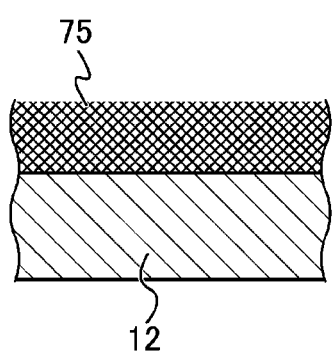
FIG. 5A is a schematic view illustrating an example of a process of coating a deposit adhered to a shower plate.

A member that can be heated to 320 degrees C. or higher among the members in the chamber 1, such as the shower head 12, has a Ti film 75 formed thereon instead of a deposit 70 containing TiCl$_x$, as illustrated in FIG. 5A. The Ti film 75 is more difficult to peel off than the deposit 70 containing TiCl$_x$. However, when the process of forming a Ti film on a plurality of substrates W is repeated, the Ti film 75 formed on the surfaces of the members in the chamber 1 becomes thicker. When the Ti film 75 becomes thick, the Ti film 75 may peel off from the inner wall of the chamber 1 or the like due to the film stress of the Ti film 75.

Figure 5B:
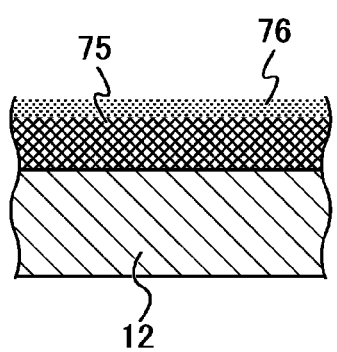
FIG. 5B is a schematic view illustrating an example of a process of coating a deposit adhered to the shower plate.

In order to make the Ti film 75 difficult to peel off, it is conceivable to reduce the film stress of the Ti film 75. In the present embodiment, NH$_3$ gas is supplied into the chamber 1 in step S109. As a result, the surface of the Ti film 75 is nitrided to form a TiN film 76, for example, as illustrated in FIG. 5B. The TiN film 76, which has a film stress opposite to that of the Ti film 75, is capable of reducing the film stress of the Ti film 75.

Figure 5C:
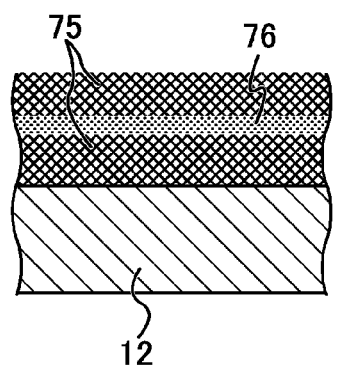
FIG. 5C is a schematic view illustrating an example of a process of coating a deposit adhered to the shower plate.

Thereafter, when the process of forming the Ti film on the substrate W is repeated, the Ti film 75 is laminated again on the TiN film 76, for example, as illustrated in FIG. 5C. In that case, a TiN film 76 is further formed thereon. By alternately laminating the Ti film 75 and TiN films 76 in this way, it is possible to make the Ti film 75 difficult to peel off from the inner wall of the chamber 1 or the like.

The first embodiment has been described above. The particle suppression method of the present embodiment includes steps a), b), and c). In step a), a first processing gas containing a halogen element and a metal element is supplied into the chamber 1 accommodating a substrate W and plasmatized, thereby forming a film on the substrate W. In step b), a second processing gas including hydrogen gas is supplied into the chamber 1 and plasmatized, thereby reducing the surface of the deposit formed on the inner wall of the chamber 1. In step c), the reduced surface of the deposit is nitrided by supplying a third processing gas containing a nitrogen element into the chamber 1. This makes it possible to suppress the generation of particles in the chamber 1.

In addition, in the particle suppression method of the present embodiment, in step c), the third processing gas supplied into the chamber 1 may be plasmatized to nitride the reduced surface of the deposit.

In addition, the particle suppression method of the present embodiment further includes step a4) of carrying out the substrate W on which the film containing the metal element is formed from the chamber 1, wherein step a) and step c) are performed after step a4). This makes it possible to reduce the influence of the process for suppressing the generation of particles in the chamber 1 on the film quality of the substrate W.

In the present embodiment, step b) is performed based on the number of substrates W on which step a) has been performed. This makes it possible to nitride the surface of the deposit 70 before the deposit 70 adhered to the inner wall 1c of the chamber 1 and the inner wall 51a of the exhaust chamber 51 peels off.

In the present embodiment, the halogen element contained in the first processing gas is Cl, and the metal element contained in the first processing gas is Ti. The first processing gas is TiCl$_4$ gas. The second processing gas is a mixed gas of H$_2$ gas and a rare gas. The third processing gas is NH$_3$ gas. This makes it possible to suppress the generation of particles in the chamber 1 when a film containing a metal element is formed on a substrate W in the chamber 1.

Second Embodiment

In the present embodiment, every time Ti films are formed for a predetermined number of substrates W, the interior of the chamber 1 is cleaned, and precoating is performed on the inner wall of the chamber 1. Then, in the precoating of the inner wall of the chamber 1, deposition of TiCl$_x$, reduction of the surface of the deposit, and nitridation of the reduced surface of the deposit are performed. This makes it possible to suppress the generation of particles from the precoated film after cleaning.

Figure 6:
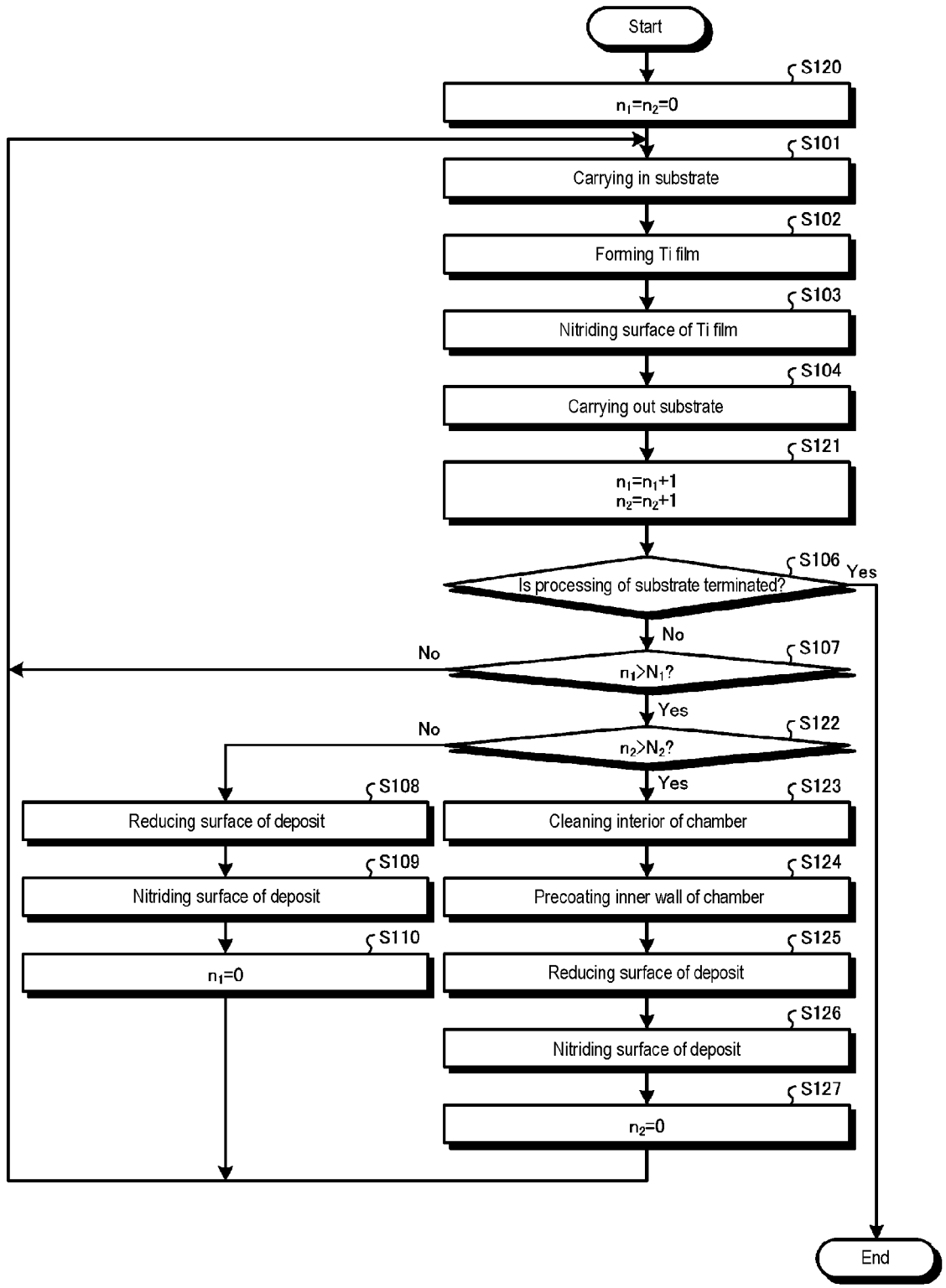
FIG. 6 is a flowchart illustrating an example of a particle suppression method in a second embodiment.

FIG. 6 is a flowchart illustrating an example of the particle suppression method in the second embodiment. Each process exemplified in the flowchart of FIG. 6 is implemented by the control device 60 controlling each part of the plasma processing apparatus 100. In addition, in FIG. 6, the processes denoted by the same reference numerals as those in FIG. 2 are the same as the processes described with reference to FIG. 2, so detailed descriptions thereof will be omitted.

First, the control device 60 initializes variables n$_1$ and n$_2$ for counting the number of substrates W to 0 (S120). Then, the process illustrated in step S101 is performed.

After the process illustrated in step S104 is performed, the control device 60 increments the variables n$_1$ and n$_2$ by 1 (S121). Then, the process illustrated in step S106 is performed.

When the variable n$_1$ is greater than the constant N$_1$ (S107: "Yes"), the control device 60 determines whether the variable n$_2$ is greater than a predetermined constant N$_2$ (S122). In the present embodiment, the constant N$_2$ is, for example, 1,499. When the variable n$_2$ is equal to or less than the constant N$_2$ (S122: "No"), the process illustrated in step S108 is performed.

When the variable $n_2$ is greater than the constant $N_2$ (S122: "Yes"), the control device 60 cleans the interior of the chamber 1 (S123). Step S123 is an example of step d). In step S123, a cleaning gas containing a fluorine element is supplied into the chamber 1 from a cleaning gas source (not illustrated), and the pressure inside the chamber 1 is controlled to a predetermined pressure by the exhaust device 53. As a result, a deposit adhered to the inner wall 1c of the chamber 1 and the inner wall 51a of the exhaust chamber 51 is removed. As the cleaning gas containing the fluorine element, for example, $ClF_3$ gas is used. The cleaning gas containing the fluorine element is an example of the fourth gas.

Next, the inner wall 1c of the chamber 1 and the inner wall 51a of the exhaust chamber 51 are precoated (S124). Step S124 is an example of step e). In step S124, $TiCl_4$ gas, $H_2$ gas, and Ar gas are supplied from the gas supply mechanism 20 into the chamber 1, and the pressure in the chamber 1 is controlled to a predetermined pressure by the exhaust device 53. Then, by supplying RF power into the chamber 1 via the matcher 44 and the shower head 10, the gas in the chamber 1 is plasmatized, and a deposit is formed on the inner wall 1c of the chamber 1 and the inner wall 51a of the exhaust chamber 51 by the active species contained in the plasma.

The main processing conditions in step S124 are, for example, as follows.
   Pressure in chamber 1: 50 to 1,333 Pa
   RF power: 10 to 3,000 W
   $TiCl_4$ gas/$H_2$ gas/Ar gas: 5 to 100 sccm/1 to 500 sccm/10 to 10,000 sccm
   Processing time: 1 to 600 seconds Next, the surfaces of the deposits formed on the inner wall 1c of the chamber 1 and the inner wall 51a of the exhaust chamber 51 are reduced (S125). Step S125 is an example of step f). In step S125, $H_2$ gas and Ar gas are supplied from the gas supply mechanism 20 into the chamber 1, and the pressure in the chamber 1 is controlled to a predetermined pressure by the exhaust device 53. Then, RF power is supplied into the chamber 1 via the matcher 44 and the shower head 10 to plasmatize the gas within the chamber 1. Then, the surface of the deposit adhered to the inner wall 1c of the chamber 1 and the inner wall 51a of the exhaust chamber 51 is reduced by the active species contained in the plasma.

The main processing conditions in step S125 are, for example, as follows.
   Pressure in chamber 1: 50 to 1,333 Pa
   RF power: 10 to 3,000 W
   $H_2$ gas/Ar gas: 5 to 10,000 sccm/0 to 10,000 sccm
   Processing time: 1 to 180 seconds Next, the surface of the deposit adhered to the inner wall 1c of the chamber 1 and the inner wall 51a of the exhaust chamber 51 is nitrided (S126). Step S126 is an example of step g). In step S126, $NH_3$ gas is supplied from the gas supply mechanism 20 into the chamber 1, and the pressure in the chamber 1 is controlled to a predetermined pressure by the exhaust device 53. As a result, the reduced surface of the deposit is nitrided.

The main processing conditions in step S126 are, for example, as follows.
   Pressure in chamber 1: 50 to 1,333 Pa
   $NH_3$ gas/$H_2$ gas/Ar gas: 10 to 10,000 sccm/5 to 10,000 sccm/0 to 10,000 sccm
   Processing time: 1 to 180 seconds In step S126, RF power may be supplied into the chamber 1 to plasmatize the gas supplied into the chamber 1. In this case, the magnitude of the RF power supplied into the chamber 1 is, for example, 3,000 W or less.

Next, the control device 60 initializes the variable $n_2$ to 0 (S127). Then, the process illustrated in step S101 is performed again.

In the example of FIG. 6, steps S124, S125, and S126 are each performed once after step S123 is performed, but the technique disclosed herein is not limited thereto. As another example, after step S123 is performed, the three steps of steps S124, S125, and S126 may be repeated multiple times in this order.

The second embodiment has been described above. The particle suppression method of the present embodiment further includes steps d), e), f), and g). In step d), by supplying the fourth processing gas containing a fluorine element into the chamber 1, a deposit adhered to the inner wall of the chamber 1 is removed. In step e), the first processing gas is supplied into the chamber 1 and plasmatized, thereby forming a deposit on the inner wall of the chamber 1. In step f), the second processing gas is supplied into the chamber 1 and plasmatized, thereby reducing the surface of the deposit formed on the inner wall of the chamber 1. In step g), by supplying the third processing gas into the chamber 1, the reduced surface of the deposit is nitrided. This makes it possible to suppress the generation of particles from the precoated film after cleaning.

In addition, in the particle suppression method of the present embodiment, in step g), the third processing gas supplied into the chamber 1 may be plasmatized to nitride the reduced surface of the deposit.

Third Embodiment

In the present embodiment, in the precoating of the inner wall of the chamber 1 performed before forming a Ti film on the substrate W, deposition of $TiCl_x$, reduction of the surface of a deposit, and nitridation of the reduced surface of the deposit are performed. This makes it possible to suppress the generation of particles from the precoated film.

Figure 7:
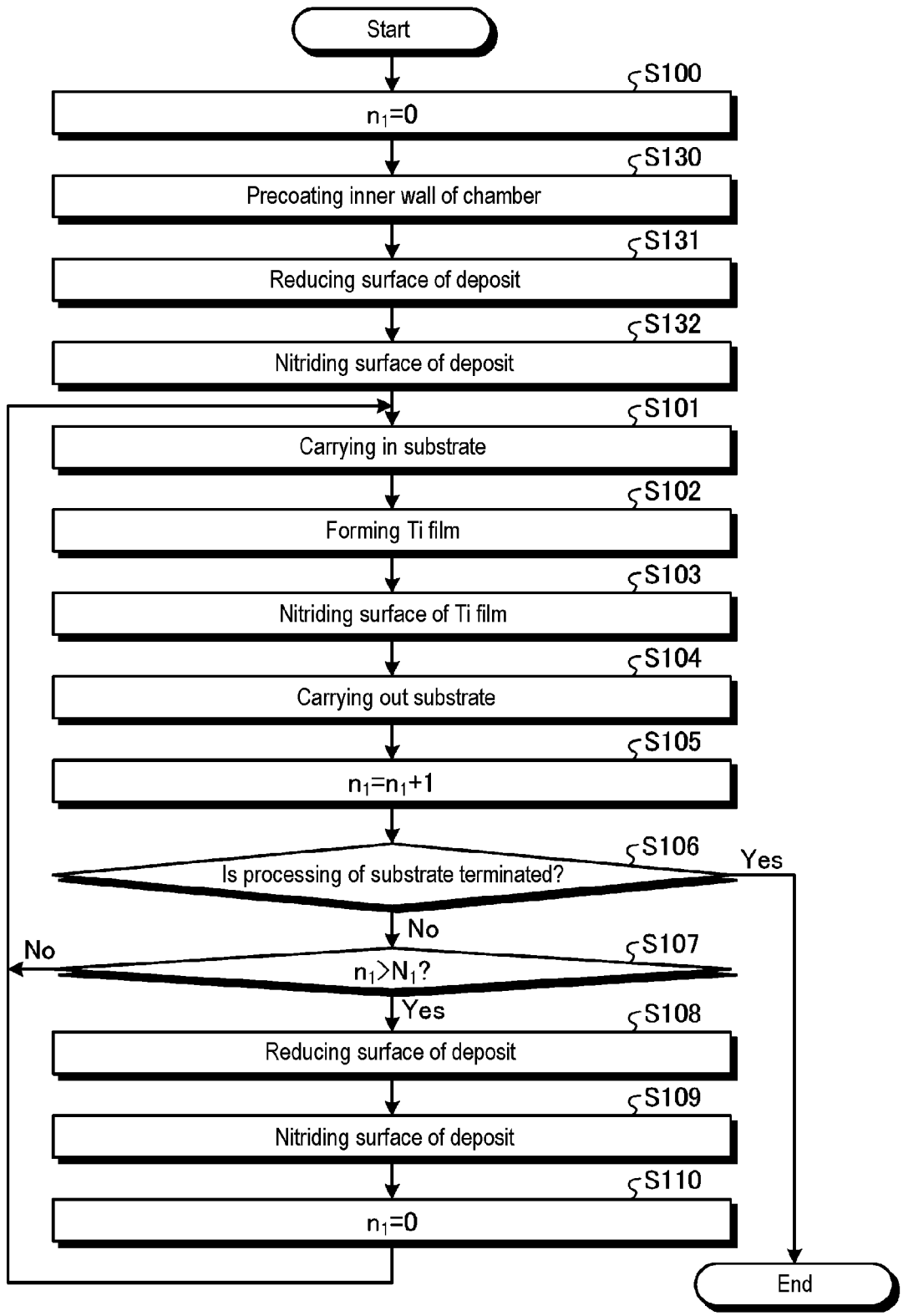
FIG. 7 is a flowchart illustrating an example of a particle suppression method in a third embodiment.

FIG. 7 is a flowchart illustrating an example of the particle suppression method in the third embodiment. Each process exemplified in the flowchart of FIG. 7 is implemented by the control device 60 controlling each part of the plasma processing apparatus 100. In addition, in FIG. 7, the processes denoted by the same reference numerals as those in FIG. 2 are the same as the processes described with reference to FIG. 2, so detailed descriptions thereof will be omitted.

After initializing the variable $n_1$, the inner wall 1c of the chamber 1 and the inner wall 51a of the exhaust chamber 51 are precoated (S130). Step S130 is an example of step h). In step S130, $TiCl_4$ gas, $H_2$ gas, and Ar gas are supplied from the gas supply mechanism 20 into the chamber 1, and the pressure in the chamber 1 is controlled to a predetermined pressure by the exhaust device 53. Then, by supplying RF power into the chamber 1 via the matcher 44 and the shower head 10, the gas in the chamber 1 is plasmatized, and a deposit is formed on the inner wall 1c of the chamber 1 and the inner wall 51a of the exhaust chamber 51 by the active species contained in the plasma.

The main processing conditions in step S130 are, for example, as follows.
   Pressure in chamber 1: 50 to 1,333 Pa
   RF power: 10 to 3,000 W
   $TiCl_4$ gas/$H_2$ gas/Ar gas: 5 to 100 sccm/1 to 500 sccm/10 to 10,000 sccm
   Processing time: 1 to 600 seconds Next, the surface of the deposit adhered to the inner wall 1c of the chamber 1 and the inner wall 51a of the exhaust chamber 51 is reduced (S131). Step S131 is an example of step i). In step S131, $H_2$ gas and Ar gas are supplied from the gas supply mechanism 20 into the chamber 1, and the pressure in the chamber 1 is controlled to a predetermined pressure by the exhaust device 53. Then, RF power is supplied into the chamber 1 via the matcher 44 and the shower head 10 to plasmatize the gas within the chamber 1. Then, the surface of the deposit adhered to the inner wall 1c of the chamber 1 and the inner wall 51a of the exhaust chamber 51 is reduced by the active species contained in the plasma.

The main processing conditions in step S131 are, for example, as follows.

Pressure in chamber 1: 50 to 1,333 Pa
RF power: 10 to 3,000 W
$H_2$ gas/Ar gas: 5 to 10,000 sccm/0 to 10,000 sccm
Processing time: 1 to 180 seconds Next, the surface of the deposit adhered to the inner wall 1c of the chamber 1 and the inner wall 51a of the exhaust chamber 51 is nitrided (S132). Step S132 is an example of step j). In step S132, $NH_3$ gas is supplied from the gas supply mechanism 20 into the chamber 1, and the pressure in the chamber 1 is controlled to a predetermined pressure by the exhaust device 53. As a result, the surface of the deposit reduced in step S131 is nitrided. Then, the process illustrated in step S101 is performed.

The main processing conditions in step S132 are, for example, as follows.

Pressure in chamber 1: 50 to 1,333 Pa
$NH_3$ gas/$H_2$ gas/Ar gas: 10 to 10,000 sccm/5 to 10,000 sccm/0 to 10,000 sccm
Processing time: 1 to 180 seconds In step S132, RF power may be supplied into the chamber 1 to plasmatize the gas supplied into the chamber 1. In this case, the magnitude of the RF power supplied into the chamber 1 is, for example, 3,000 W or less.

The third embodiment has been described above. The particle suppression method of the present embodiment includes steps h), i), and j). Step h) is performed before step a), and in step h), the first process gas is supplied into the chamber 1 and plasmatized, thereby forming a deposit on the inner wall of the chamber 1. Step i) is performed before step a) and after step h), and in step i), a second processing gas is supplied into the chamber 1 and plasmatized, thereby reducing the surface of the deposit formed on the inner wall of the chamber 1. Step j) is performed before step a) and after step i), and in step j), a third processing gas is supplied into the chamber 1, thereby nitriding the reduced surface of the deposit. This makes it possible to suppress the generation of particles from the precoated film formed on the inner wall of the chamber 1 or the like before forming a Ti film on a substrate W.

In the particle suppression method of the present embodiment, in step j), the third processing gas supplied into the chamber 1 may be plasmatized to nitride the reduced surface of the deposit.

Fourth Embodiment

In the present embodiment, after forming the Ti film on the substrate W and before nitriding the surface of the Ti film formed on the substrate W, the surface of the Ti film formed on the substrate W is reduced using plasma generated from $H_2$ gas. This makes it possible to shorten the time required for nitriding the surface of the Ti film formed on the substrate W. In addition, it is possible to reduce the surface of the deposit adhered to the inner wall 1c of the chamber 1 and the inner wall 51a of the exhaust chamber 51 by plasma generated from the $H_2$ gas. This makes it possible to reduce the time required to reduce the surface of the deposit adhered to the inner wall 1c of the chamber 1 and the inner wall 51a of the exhaust chamber 51 after the substrate W is carried out.

Figure 8:
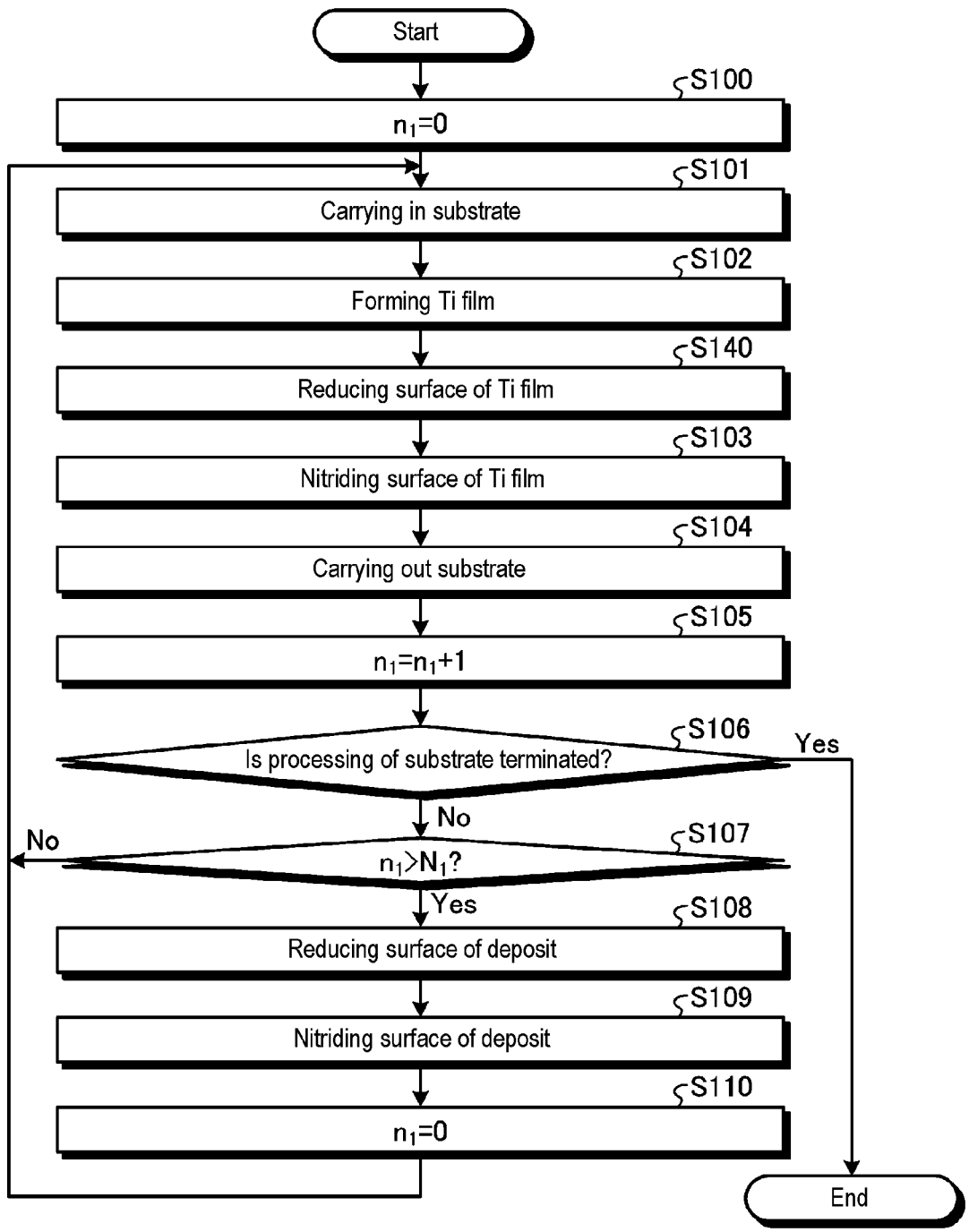
FIG. 8 is a flowchart illustrating an example of a particle suppression method in a fourth embodiment.

FIG. 8 is a flowchart illustrating an example of the particle suppression method in the fourth embodiment. Each process exemplified in the flowchart of FIG. 8 is implemented by the control device 60 controlling each part of the plasma processing apparatus 100. In addition, in FIG. 8, the processes denoted by the same reference numerals as those in FIG. 2 are the same as the processes described with reference to FIG. 2, so detailed descriptions thereof will be omitted.

After the Ti film is formed on the surface of the substrate W in step S102, the surface of the Ti film is reduced (S140). Step S140 is an example of step a2). In step S140, $H_2$ gas is supplied from the gas supply mechanism 20 into the chamber 1, and the pressure in the chamber 1 is controlled to a predetermined pressure by the exhaust device 53. Then, by supplying RF power into the chamber 1 via the matcher 44 and the shower head 10, the gas in the chamber 1 is plasmatized, and the surface of the Ti film formed on the substrate W by the active species contained in the plasma. Then, the process illustrated in step S103 is performed.

The main processing conditions in step S140 are, for example, as follows.

Figure 9:
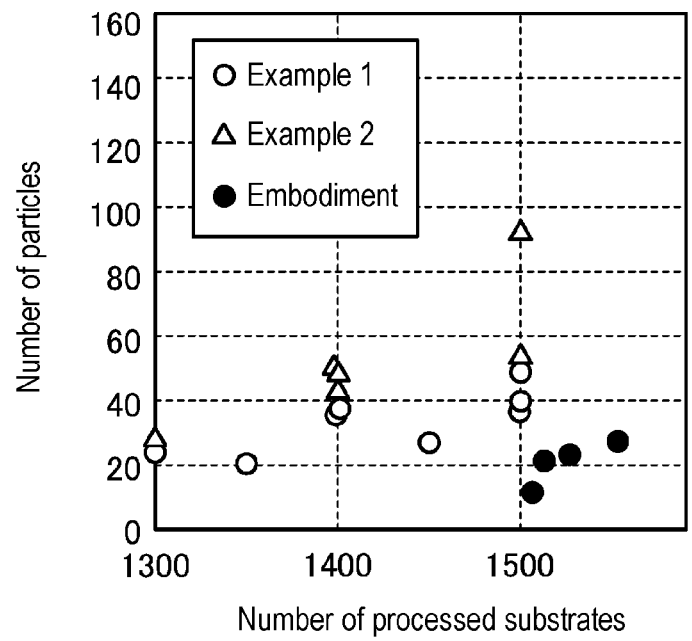
FIG. 9 is a diagram showing an example of results of measuring the numbers of particles.

Pressure in chamber 1: 0 to 1,333 Pa
RF power: 10 to 3,000 W
$H_2$ gas/Ar gas: 5 to 10,000 sccm/0 to 10,000 sccm
Processing time: 1 to 180 seconds FIG. 9 is a diagram showing an example of results of measuring the number of particles. Comparative Example 1 shown in FIG. 9 is an example in which the process of step S108 is not performed in the processes illustrated in FIG. 8. Comparative Example 2 is an example in which the processes of steps S140 and S108 are not performed in the processes illustrated in FIG. 8.

As shown in FIG. 9, in the 1,500$^{th}$ substrates W in Comparative Examples 1 and 2, about 50 particles were detected on the substrates W. Thus, it can be seen that the initialization of the inner wall 1c or the inner wall 51a by cleaning the interior of the chamber 1 or the exhaust chamber 51 using the fourth processing gas and the precoating are required. In contrast, when the 1501$^{st}$ substrate W is processed according to the present embodiment, the number of particles detected on the substrate W is suppressed to about ten. Therefore, it is possible to reduce the number of particles generated in the chamber 1 by the method of the present embodiment.

The fourth embodiment has been described above. In the present embodiment, step a) includes steps a1), a2), and step a3). In step a1), the first processing gas containing a metal element is supplied into the chamber 1 and plasmatized, thereby forming a film containing the metal element on the substrate W. In step a2), the second processing gas is supplied into the chamber 1 and plasmatized, thereby reducing the surface of the film containing the metal element and formed on the substrate W. In step a3), the third processing gas is supplied into the chamber 1 and the surface of the film containing the metal element is exposed to the third processing gas, thereby nitriding the reduced surface of the film containing the metal element. This makes it possible to shorten the time required for nitriding the surface of the Ti film formed on the substrate W. In addition, it is possible to reduce the surface of the deposit adhered to the inner wall 1*c* of the chamber 1 and the inner wall 51*a* of the exhaust chamber 51 by plasma generated from the H$_2$ gas. This makes it possible to shorten the time required to reduce the surface of the deposit adhered to the inner wall 1*c* of the chamber 1 and the inner wall 51*a* of the exhaust chamber 51 after the substrate W is carried out.

Others

The present disclosure is not limited to the embodiments described above, and various modifications are possible within the scope of the gist thereof.

For example, in the above-described embodiments, Ti was used as an example of the metal element contained in a film formed on a substrate W, but the disclosed technique is not limited thereto. As the metal element contained in the film formed on the substrate W, tantalum (Ta), tungsten (W), or the like is also considered in addition to Ti. When a film containing Ta is formed on a substrate W, for example, TaCl$_5$ gas is used as the first processing gas instead of TiCl$_4$ gas.

Figure 10:
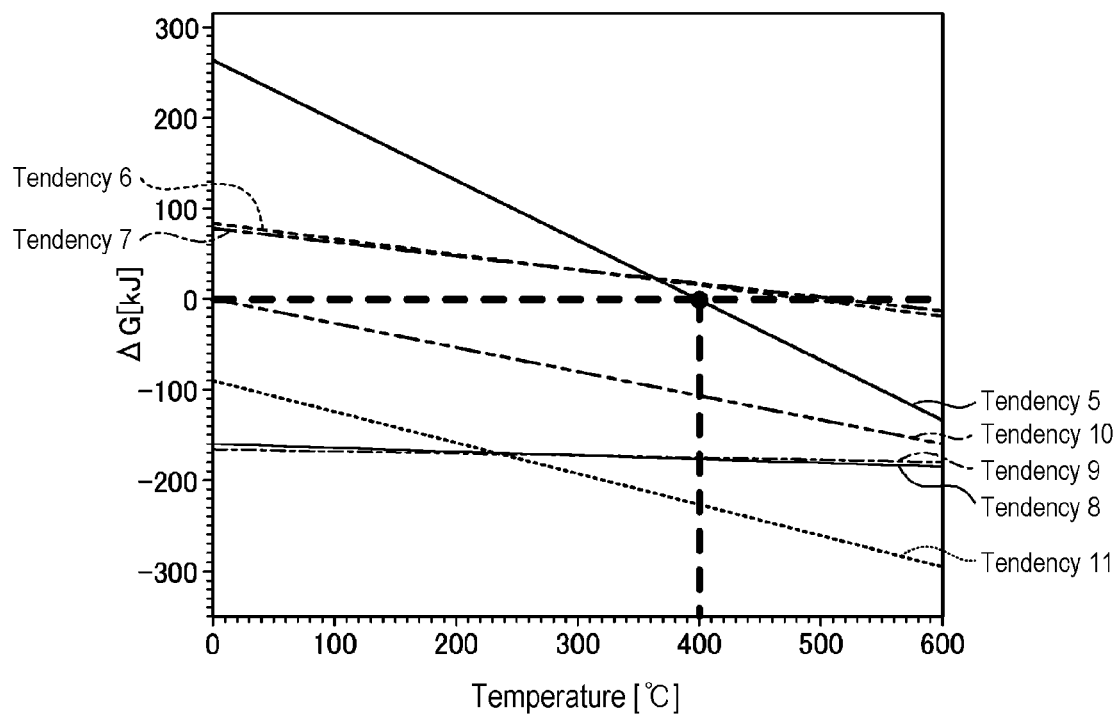
FIG. 10 is a diagram showing an example of relationships between the amount of change in Gibbs free energy and temperature.

FIG. 10 is a diagram showing an example of relationships between the amount of change ΔG in Gibbs free energy and temperature. Tendency 5 exemplified in FIG. 10 shows the relationship between the amount of change ΔG in Gibbs free energy and temperature in Reaction Formula (5) below.

$$2TaCl_4+2NH_3 \rightarrow 2TaN+6HCl+Cl_2 \qquad (5)$$

Referring to Tendency 5 exemplified in FIG. 10, the reaction of Reaction Formula (5) proceeds, that is, the amount of change ΔG in Gibbs free energy becomes negative when the temperature is 400 degrees C. or higher. Therefore, if it is possible to maintain the inner wall 1*c* of the chamber 1 and the inner wall 51*a* of the exhaust chamber 51 at a temperature of 400 degrees C. or higher, the surface of the deposit containing TaCl$_4$ or the like and adhered to the inner wall 1*c* of the chamber 1 and the inner wall 51*a* of the exhaust chamber 51 is nitrided by NH$_3$ gas. Then, the surface of the deposit containing TaCl$_4$ or the like changes to TaN according to Reaction Formula (5).

In addition, for example, Tendency 6 illustrated in FIG. 10 shows the relationship between the amount of change ΔG in Gibbs free energy and temperature in Reaction Formula (6) below. Tendency 6 in FIG. 10 shows the tendency in the case where H$_2$ gas is not plasmatized.

$$2TaCl_4+H_2 \rightarrow TaCl_2+2HCl \qquad (6)$$

In addition, for example, Tendency 7 illustrated in FIG. 10 shows the relationship between the amount of change ΔG in Gibbs free energy and temperature in Reaction Formula (7) below. Tendency 7 in FIG. 10 shows the tendency in the case where H$_2$ gas is not plasmatized.

$$2TaCl_4+H_2 \rightarrow 2TaCl_3+2HCl \qquad (7)$$

Referring to Tendencies 6 and 7 in FIG. 10, the amounts of change ΔG in Gibbs free energy do not become negative unless the temperature is much higher than 400 degrees C. Therefore, the reactions represented by Reaction Formulas (6) and (7) do not proceed unless the temperature is much higher than 400 degrees C.

In addition, for example, Tendency 8 illustrated in FIG. 10 shows the relationship between the amount of change ΔG in Gibbs free energy and temperature in Reaction Formula (8) below. In addition, Tendency 8 in FIG. 10 shows the tendency when H$_2$ gas is plasmatized.

$$TaCl_3+H \rightarrow TaCl_2+HCl \qquad (8)$$

For example, Tendency 9 illustrated in FIG. 10 shows the relationship between the amount of change ΔG in Gibbs free energy and temperature in Reaction Formula (9) below. In addition, Tendency 9 in FIG. 10 shows the tendency when H$_2$ gas is plasmatized.

$$TaCl_4+H \rightarrow TaCl_3+HCl \qquad (9)$$

Referring to Tendencies 8 and 9 in FIG. 10, the amounts of change ΔG in Gibbs free energy are negative in almost all temperature zones. Therefore, the reactions represented by Reaction Formulas (8) and (9) proceed in almost all temperature zones.

In addition, for example, Tendency 10 illustrated in FIG. 10 shows the relationship between the amount of change ΔG in Gibbs free energy and temperature in Reaction Formula (10) below.

$$TaCl_3+NH_3 \rightarrow TaN+3HCl \qquad (10)$$

In addition, for example, Tendency 11 illustrated in FIG. 10 shows the relationship between the amount of change ΔG in Gibbs free energy and temperature in Reaction Formula (11) below. In addition, Tendency 11 in FIG. 10 shows the tendency when NH$_3$ gas is plasmatized.

$$2TaCl_2+2NH_3 \rightarrow 2TaN+4HCl+H_2 \qquad (11)$$

Referring to Tendencies 10 and 11 in FIG. 10, the amounts of change ΔG in Gibbs free energy are negative in the positive temperature zone. Therefore, even at a temperature lower than 400 degrees C. (e.g., normal temperature), the nitriding reaction by NH$_3$ gas represented by Reaction Formulas (10) and (11) proceed.

Thus, on the inner wall 1*c* of the chamber 1 and the inner wall 51*a* of the exhaust chamber 51, which are difficult to maintain at a temperature of 400 degrees C. or higher, even when NH$_3$ gas is supplied to the deposit containing TaCl$_4$, the surface of the deposit is difficult to nitride, for example, as shown in Tendency 5 of FIG. 10.

In contrast, by exposing the deposit containing TaCl$_4$ to plasma generated from a gas including H$_2$ gas, TaCl$_4$ is reduced to TaCl$_2$ or TaCl$_3$ at a temperature below 400 degrees C., as shown in Tendencies 8 and 9 of FIG. 10.

Then, the deposit containing TaCl$_2$ or TaCl$_3$ is exposed to NH$_3$ gas. As a result, as shown in Tendencies 10 and 11 in FIG. 10 and represented by Reaction Formulas (10) and (11) above, TaCl$_2$ or TaCl$_3$ is nitrided to TaN at a temperature below 400 degrees C. As a result, the surface of the deposit, which easily peels off, is coated with a nitride layer containing TaN so that scattering of the deposit can be suppressed.

In addition, in each of the above-described embodiments, since a processing gas and RF power are supplied from the shower head 10 into the chamber 1, many active species contained in the plasma are present in the vicinity of a substrate W. However, depending on the processing conditions, the active species contained in the plasma may not reach the inner wall 1*c* of the chamber 1 and the inner wall 51*a* of the exhaust chamber 51 sufficiently. Therefore, in addition to the shower head 10, the matcher 44, and the RF power supply 45, for example, as shown in FIG. 11, a remote plasma generator 80 may be separately provided for supplying active species to the vicinity of the deposit to be coated.

Figure 11:
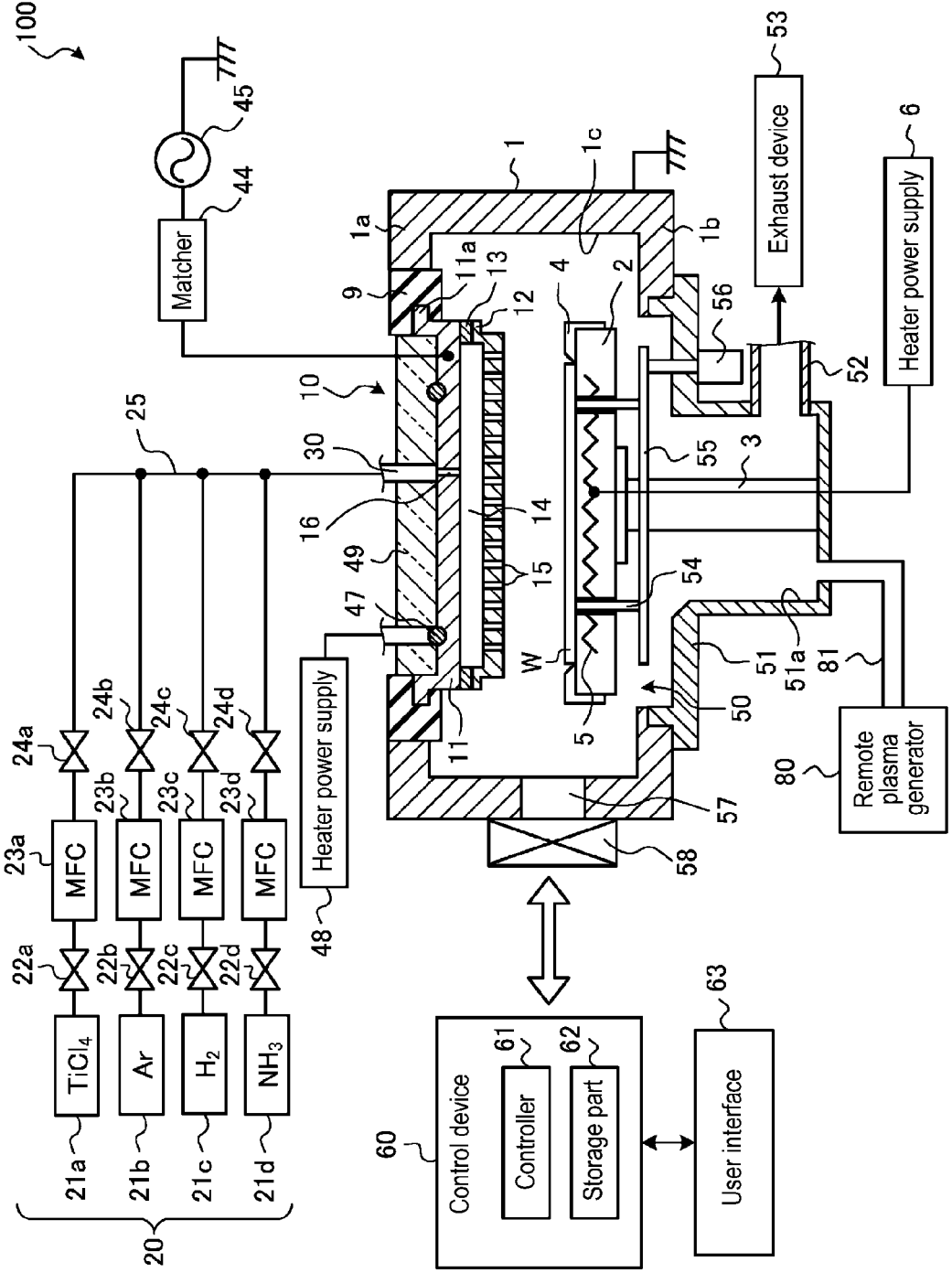
FIG. 11 is a view illustrating another example of a plasma processing apparatus.

In the example of FIG. 11, the remote plasma generator 80 is connected to the exhaust chamber 51 via a pipe 81. The remote plasma generator 80 supplies the active species contained in plasma generated from gas containing H$_2$ gas to deposits formed on the inner wall 1*c* of the chamber 1 and the inner wall 51a of the exhaust chamber 51. NH$_3$ gas is supplied into the chamber 1 from the gas supply mechanism 20. This makes it possible to nitride the surfaces of the deposits formed on the inner wall 1c and the inner wall 51a of the exhaust chamber 51 more efficiently.

Further, in each of the above-described embodiments, the reduction and nitridation of deposits formed on the inner wall 1c of the chamber 1 and the inner wall 51a of the exhaust chamber 51 are performed depending on the number of substrates W subjected to the film forming process, but the disclosed technique is not limited thereto. When the reduction and nitridation of the deposits are performed before the deposits formed on the inner wall 1c of the chamber 1 and the inner wall 51a of the exhaust chamber 51 peel off, the reduction and nitridation of the deposits may be performed based on other information. For example, the reduction and nitridation of deposits formed on the inner wall 1c of the chamber 1 and the inner wall 51a of the exhaust chamber 51 may be performed based on the cumulative thickness of Ti films formed on a plurality of substrates W or the cumulative time of plasma processing during the formation of Ti films on the substrates W.

In each of the above-described embodiments, the first processing gas supplied from the source 21a is, for example, TiCl$_4$ gas, but the disclosed technique is not limited to thereto. Alternatively, the first processing gas supplied from the source 21a may be TaCl$_5$ gas, WCl$_4$ gas, WCl$_5$ gas, WCl$_6$ gas, or the like.

In each of the above-described embodiments, the second processing gas is a mixed gas of H$_2$ gas and Ar gas, but the disclosed technique is not limited thereto. Alternatively, the second processing gas may be a mixture of H$_2$ gas and another rare gas. Alternatively, the second processing gas may be H$_2$ gas.

In each of the above-described embodiments, the third processing gas supplied from the source 21d is NH$_3$ gas, but the disclosed technique is not limited thereto. Alternatively, the third processing gas may be N$_2$ gas or a mixed gas of H$_2$ gas and N$_2$ gas.

In each of the above-described embodiments, the plasma processing apparatus 100 that performs a process using capacitively-coupled plasma (CCP) as an example of a plasma source has been described, but the plasma source is not limited thereto. Examples of plasma sources other than the capacitively coupled plasma include inductively coupled plasma (ICP), microwave-excited surface-wave plasma (SWP), electron cyclotron resonance plasma (ECP), and helicon-wave-excited plasma (HWP).

It shall be understood that the embodiments disclosed herein are examples in all respects and are not restrictive. Indeed, the above-described embodiments can be implemented in various forms. The above-described embodiments may be omitted, replaced, or modified in various forms without departing from the scope and spirit of the appended claims.

According to various aspects and embodiments of the present disclosure, it is possible to suppress the generation of particles in a chamber.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A particle suppression method comprising:
    a) supplying a first processing gas containing a halogen element and a metal element into a chamber in which a substrate is accommodated and plasmatizing the first processing gas to form a film containing the metal element on the substrate;
    a4) carrying out the substrate on which the film containing the metal element is formed from an interior of the chamber, after step a);
    b) reducing a surface of a deposit formed on an inner wall of the chamber by supplying a second processing gas including hydrogen gas into the chamber and turning the second processing gas into plasma, after step a4); and
    c) nitriding the reduced surface of the deposit by supplying a third processing gas containing a nitrogen element into the chamber, after step a4).

2. The particle suppression method of claim 1, wherein, in step c), the reduced surface of the deposit is nitrided by turning the third processing gas supplied into the chamber into plasma.

3. The particle suppression method of claim 2, wherein step a) further comprises:
    a1) supplying the first processing gas into the chamber and turning the first processing gas into plasma to form the film containing the metal element on the substrate;
    a2) reducing a surface of the film containing the metal element on the substrate and formed on the substrate by supplying the second processing gas into the chamber and turning the second processing gas into plasma; and
    a3) nitriding the reduced surface of the film containing the metal element by supplying the third processing gas into the chamber and exposing the surface of the film containing the metal element to the third processing gas.

4. The particle suppression method of claim 3, wherein step b) is performed based on at least one of a number of substrates each subjected to step a), a cumulative film thickness of films containing the metal element formed on the respective substrates when step a) is performed on a plurality of substrates, and a cumulative time of plasma processing in step a).

5. The particle suppression method of claim 4, further comprising:
    h) forming the deposit on the inner wall of the chamber by supplying the first processing gas into the chamber and plasmatizing the first processing gas, step h) being performed before step a);
    i) reducing the surface of the deposit formed on the inner wall of the chamber by supplying the second processing gas into the chamber and plasmatizing the second processing gas, step i) being performed before step a) and after step h); and
    j) nitriding the reduced surface of the deposit by supplying the third processing gas into the chamber, step j) being performed before step a) and after step i).

6. The particle suppression method of claim 5, wherein, in step j), the reduced surface of the deposit is nitrided by plasmatizing the third processing gas into the chamber.

7. The particle suppression method of claim 6, wherein, the halogen element contained in the first processing gas is Cl, and the metal element contained in the first processing gas is Ti, Ta, or W.

8. The particle suppression method of claim 7, wherein the first processing gas is $TiCl_4$ gas, $TaCl_5$ gas, $WCl_4$ gas, $WCl_5$ gas, or $WCl_6$ gas.

9. The particle suppression method of claim 8, wherein the second processing gas is $H_2$ gas or a mixed gas of $H_2$ gas and a rare gas.

10. The particle suppression method of claim 1, wherein step a) further comprises:
   a1) supplying the first processing gas into the chamber and turning the first processing gas into plasma to form the film containing the metal element on the substrate;
   a2) reducing a surface of the film containing the metal element on the substrate and formed on the substrate by supplying the second processing gas into the chamber and turning the second processing gas into plasma; and
   a3) nitriding the reduced surface of the film containing the metal element by supplying the third processing gas into the chamber and exposing the surface of the film containing the metal element to the third processing gas.

11. The particle suppression method of claim 1, wherein step b) is performed based on at least one of a number of substrates each subjected to step a), a cumulative film thickness of films containing the metal element formed on the respective substrates when step a) is performed on a plurality of substrates, and a cumulative time of plasma processing in step a).

12. The particle suppression method of claim 1, further comprising:
   d) removing the deposit adhered to the inner wall of the chamber by supplying a fourth process gas containing fluorine element into the chamber;
   e) forming the deposit on the inner wall of the chamber by supplying the first processing gas into the chamber and plasmatizing the first processing gas;
   f) reducing the surface of the deposit formed on the inner wall of the chamber by supplying the second processing gas into the chamber and plasmatizing the second processing gas; and
   g) nitriding the reduced surface of the deposit by supplying the third processing gas into the chamber.

13. The particle suppression method of claim 12, wherein, in step g), the reduced surface of the deposit is nitrided by plasmatizing the third processing gas supplied into the chamber.

14. The particle suppression method of claim 1, further comprising:
   h) forming the deposit on the inner wall of the chamber by supplying the first processing gas into the chamber and plasmatizing the first processing gas, step h) being performed before step a);
   i) reducing the surface of the deposit formed on the inner wall of the chamber by supplying the second processing gas into the chamber and plasmatizing the second processing gas, step i) being performed before step a) and after step h); and
   j) nitriding the reduced surface of the deposit by supplying the third processing gas into the chamber, step j) being performed before step a) and after step i).

15. The particle suppression method of claim 1, wherein, the halogen element contained in the first processing gas is Cl, and
   the metal element contained in the first processing gas is Ti, Ta, or W.

16. The particle suppression method of claim 1, wherein the first processing gas is $TiCl_4$ gas, $TaCl_5$ gas, $WCl_4$ gas, $WCl_5$ gas, or $WCl_6$ gas.

17. The particle suppression method of claim 1, wherein the second processing gas is $H_2$ gas or a mixed gas of $H_2$ gas and a rare gas.

18. The particle suppression method of claim 1, wherein the third processing gas is $NH_3$ gas, $N_2$ gas, or a mixed gas of $H_2$ gas and $N_2$ gas.

* * * * *